United States Patent
Watanabe et al.

[11] Patent Number: 6,124,189
[45] Date of Patent: Sep. 26, 2000

[54] METALLIZATION STRUCTURE AND METHOD FOR A SEMICONDUCTOR DEVICE

[75] Inventors: Toru Watanabe, Yokkaichi; Katsuya Okumura; Katsuhiko Hieda, both of Yokohama, all of Japan

[73] Assignee: Kabushiki Kaisha Toshiba, Kawasaki, Japan

[21] Appl. No.: 08/818,079

[22] Filed: Mar. 14, 1997

[51] Int. Cl.[7] .............................. H01L 21/3205
[52] U.S. Cl. .................. 438/586; 438/299; 438/621; 438/643; 438/653; 438/633; 438/670
[58] Field of Search ......................... 438/586, 587, 438/257, 692, 740, 670, 234, 237, 299, 621, 643, 653, 633, 672, 677

[56] References Cited

U.S. PATENT DOCUMENTS

| | | | |
|---|---|---|---|
| 4,443,930 | 4/1984 | Hwang et al. | 438/299 |
| 4,593,454 | 6/1986 | Baudrant et al. | 438/586 |
| 4,740,483 | 4/1988 | Tobin | 438/677 |
| 4,789,648 | 12/1988 | Chow et al. | 438/633 |
| 4,859,630 | 8/1989 | Josquin | 438/234 |
| 4,920,072 | 4/1990 | Keller et al. | 438/627 |
| 4,956,313 | 9/1990 | Cote et al. | 438/672 |
| 4,997,789 | 3/1991 | Keller et al. | 438/643 |
| 5,026,666 | 6/1991 | Hills et al. | 438/301 |
| 5,035,768 | 7/1991 | Mu et al. | 216/60 |
| 5,071,788 | 12/1991 | Joshi | 438/586 |
| 5,094,981 | 3/1992 | Chung et al. | 438/621 |
| 5,175,126 | 12/1992 | Ho et al. | 438/643 |
| 5,212,400 | 5/1993 | Joshi | 257/412 |
| 5,232,871 | 8/1993 | Ho | 438/653 |
| 5,300,455 | 4/1994 | Vuillermoz et al. | 438/653 |
| 5,338,698 | 8/1994 | Subbanna | 438/237 |
| 5,352,631 | 10/1994 | Sitaram et al. | 438/300 |
| 5,422,308 | 6/1995 | Nicholls et al. | 438/233 |
| 5,474,947 | 12/1995 | Chang et al. | 438/257 |
| 5,585,302 | 12/1996 | Li | 438/384 |
| 5,702,965 | 12/1997 | Kim | 438/261 |
| 5,731,239 | 3/1998 | Wong et al. | 438/296 |
| 5,770,507 | 6/1998 | Chen et al. | 438/305 |
| 5,776,787 | 7/1998 | Keshtbod | 438/257 |
| 5,840,609 | 11/1998 | Hyeon et al. | 438/299 |
| 5,851,912 | 12/1998 | Liaw et al. | 438/621 |
| 5,863,837 | 1/1999 | Sudo | 438/692 |

*Primary Examiner*—Carl Whitehead, Jr.
*Assistant Examiner*—Khanh Duong
*Attorney, Agent, or Firm*—Banner & Witcoff, Ltd.

[57] ABSTRACT

A method for forming a metal-strapped polysilicon gate and for simultaneously forming a strapped-metal polysilicon gate and a metal contact filling includes the steps of forming a gate dielectric layer on a surface of a silicon substrate; forming a polysilicon layer on the gate dielectric layer; forming a first insulating layer on the polysilicon layer; forming insulating spacers on either side of the polysilicon layer and the first insulating layer; and forming ion implantation regions in the surface of the silicon substrate. Next, a second insulating layer is deposited on the silicon substrate, and the second insulating layer is polished using chemical mechanical polishing to planarize the upper surface of the second insulating layer with the upper surface of the first insulating layer as a polishing stopper. Then, a contact hole is formed in the second insulating film, wherein the contact hole is laterally spaced from the polysilicon layer and the first insulating layer. Subsequent steps include: removing the first insulating layer, thereby forming an unfilled region above the polysilicon layer; depositing a metal such as tungsten in the unfilled region and the contact hole; and polishing the deposited metal layer to planarize the upper surface of the metal with the upper surface of the second insulating layer.

47 Claims, 9 Drawing Sheets

111C 110 111g 110

METALLIZATION STRUCTURE AND METHOD FOR A SEMICONDUCTOR DEVICE

FIELD OF THE INVENTION

The present invention generally relates to a metallization structure and method for a semiconductor device and, more particularly, to a gate and contact structure for a semiconductor device and the method of making the same.

BACKGROUND OF THE INVENTION

As technology advances, semiconductor logic and memory devices require higher operation speed and accuracy to accommodate increasing performance demands. In particular, semiconductor logic devices such as CMOS (complementary metal oxide silicon) devices require low gate and contact resistivity to achieve high speed operation. In order to lower resistivity, polycide gate structures including a stacked arrangement of doped polysilicon and a silicide such as cobalt silicide ($CoSi_2$) or titanium silicide ($TiSi_2$) have been used.

To lower resistivity still further, it is desirable to use metal-strapped polysilicon gate structures which include a stacked arrangement of doped polysilicon and a metal. FIG. 16 shows a MOS transistor 1300 having such a metal-strapped polysilicon gate structure. Transistor 1300 is formed on a silicon substrate 1301 and is isolated from other elements formed on the substrate by shallow trench isolation region 1306. Spaced apart source/drain regions 1307 are formed in substrate 1301 and include lightly doped portions 1307a. The metal-strapped polysilicon gate structure includes a stacked arrangement of a doped (e.g., N+) polysilicon gate electrode 1302 and metal strap layer 1304. Metal strap layer 1304 may be formed of tungsten (W), for example. Polysilicon gate electrode 1302 is insulatively spaced from a channel region between source/drain regions 1307 by a gate dielectric film 1310. Silicide layers 1311 of titanium silicide ($TiSi_2$), for example, formed on source/drain regions 1307 serve to reduce the resistivity of contacts to the source/drain layers. Sidewall insulating layer 1303 is formed on the sidewalls of the gate structure and an interlayer insulating layer 1309 of silicon dioxide ($SiO_2$), for example, is formed on the transistor 1300. Openings 1305 in interlayer insulating layer 1309 expose silicide layers 1311 and metal wiring layers 1308 of, for example, Al—Cu fill in openings 1305.

While such metal-strapped polysilicon gate structures afford the advantage of low resistivity, a problem arises in that the process steps for forming the transistor must not result in undesirable reactions between the metal strap layer and the polysilicon gate electrode. Since such reactions can occur, for example, during heating steps greater than about 600° C., it becomes difficult to integrate certain high temperature processes (such as a high temperature annealing for repairing substrate damage which occurs during the reactive ion etching of the gate structure or a high temperature annealing for activating source/drain implantations) into the manufacturing process of a transistor including a metal-strapped polysilicon gate structure. It is proposed in Y. Akasaka et al., "Low-Resistivity Poly-Metal Gate Electrode Durable for High-Temperature Processing." IEEE Transactions on Electron Devices, Vol. 43, No. 11, November 1996, pp. 1864–1869, which is incorporated herein in its entirety, that a thin layer of $WN_x$, for example, be provided as a barrier layer between the doped polysilicon gate electrode and the metal strap layer in order to avoid undesirable reactions. However, the process described in this article requires a tightly controlled atmosphere and thus suffers from a small process window.

SUMMARY OF THE INVENTION

In view of the above-described difficulties in manufacturing a metal-strapped polysilicon gate structure, the present invention provides a simple and efficient method for achieving such a structure using a planarizing process such as chemical mechanical polishing (CMP). The method according to the present invention also enables the simultaneous formation of a low resistance, metal-strapped polysilicon gate structure and a contact structure. The present invention provides a simple method for forming a metal-strapped polysilicon gate structure while avoiding undesirable reactions between the polysilicon gate electrode and the metal strap layer.

In accordance with one aspect of the present invention, a method of forming a metal strapped polysilicon gate structure includes a steps of forming a gate dielectric layer on a surface of a substrate and forming a polysilicon layer on said gate dielectric layer. A masking layer is formed on the polysilicon layer. The masking layer is then patterned and the polysilicon layer is etched using the patterned masking layer as a mask to form a gate electrode. An insulating layer is formed on the substrate and the patterned masking layer is removed to thereby form an unfilled region above the gate electrode. A metal is then deposited to fill in the unfilled region.

In accordance with another aspect of the present invention, a method of forming a gate structure and a contact structure includes the steps of forming a gate dielectric layer on a surface of a substrate and forming a polysilicon layer on the gate dielectric layer. A masking layer is formed on the polysilicon layer. The masking layer is patterned and the polysilicon layer is then etched using the patterned masking layer as a mask to form a gate electrode. Ions are implanting in the substrate using the patterned masking layer and the gate electrode as an implantation mask to thereby form spaced apart source/drain regions. An insulating layer is deposited on the substrate and a contact hole is formed in then insulating layer for contacting at least one of the source/drain regions. The patterned masking layer is then removed to form an unfilled region above the gate electrode. A metal is deposited to fill in the unfilled region and the contact hole.

Various additional advantages and features of novelty which characterize the invention are further pointed out in the claims that follow. However, for a better understanding of the invention and its advantages, reference should be made to the accompanying drawings and descriptive matter which illustrate and describe the invention.

BRIEF DESCRIPTION OF THE DRAWINGS

FIGS. 2A and 2B through 6A and 6B provide sequential illustrations of the steps of manufacturing the structure shown in FIG. 1.

FIGS. 8A and 8B through 11A and 11B provide sequential illustrations of the steps of manufacturing the structure shown in FIGS. 7A–7C.

DETAILED DESCRIPTION

A method according to the present invention will now be described in detail with reference to the accompanying drawings. The method is described herein with reference to MOSFETs of the N-channel (NMOS) or P-channel (PMOS) type. It will be appreciated that the MOSFETs of the present invention may be utilized in semiconductor devices including, but not limited to, logic devices such as gate arrays and microprocessors, and memories such as DRAMs, SRAMs, PROMs, mask ROMs and Flash memory devices.

Figure 1A:
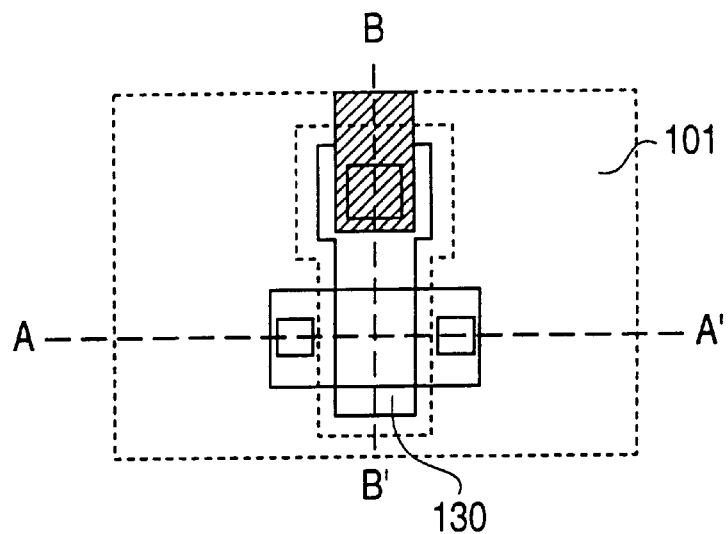
FIG. 1A is a top planar view of a MOS transistor in accordance with a first embodiment of the present invention.
Figure 1B:
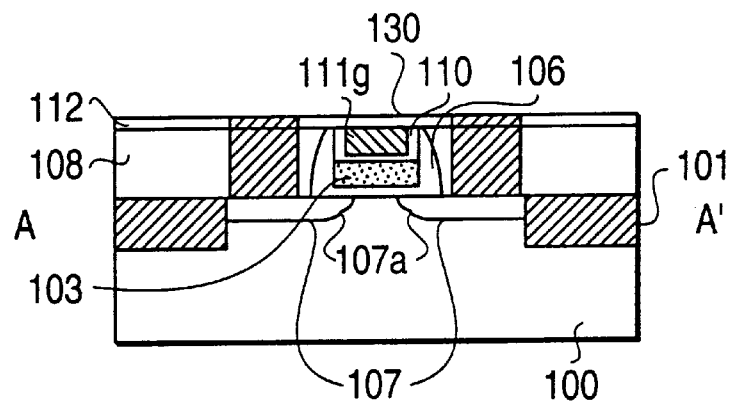
FIG. 1B is a cross-sectional view taken along line A–A' of FIG. 1A.
Figure 1C:
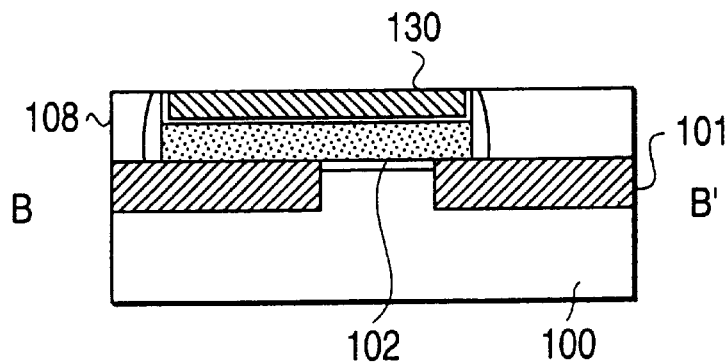
FIG. 1C is a cross-sectional view taken along line B–B' of FIG. 1A.

FIGS. 1A, 1B and 1C illustrate a MOS transistor including a metal-strapped gate structure formed in accordance with a first embodiment of the present invention. FIG. 1A is an upper plan view of the MOS transistor; FIG. 1B is a cross-sectional view taken along line A–A' of FIG. 1A; and FIG. 1C is a cross-sectional view taken along line B–B' of FIG. IA. As shown most clearly in FIGS. 1B and 1C, the MOS transistor is formed on a P-type silicon substrate 100 having a <100>orientation and resistivity of between about 1–20 Ωcm. Substrate 100 may be a silicon wafer or an epitaxial layer formed on silicon. The MOS transistor may be formed directly on a substrate, as shown, or in a doped well region of a substrate. The MOS transistor is formed in an active area (AA) of the substrate 100 which is isolated from other elements (not shown) by shallow trench isolation (STI) region 101. Spaced apart source/drain diffusion regions 107 of N+-conductivity type (in the case of an N-channel MOS transistor) or P+-conductivity type (in the case of a P-channel MOS transistor) are formed in substrate 100. The source/drain regions shown in FIG. 1B include lightly doped portions 107a, although the invention is not limited to MOSFETs having such lightly doped portions. A gate structure 130 is insulatively spaced from a channel region between source/drain regions 107 by a gate dielectric film 102. Gate structure 130 includes a tungsten layer 111g, a titanium nitride/titanium layer 110, and a doped polysilicon gate electrode 103. In this embodiment, tungsten (W) is used as the metal in the gate structure and the titanium nitride/titanium layer 110 serves as an adhesion layer for the tungsten. Tungsten is advantageous due to its low resistivity as compared to doped polysilicon and its ability to be formed using CVD to achieve good step coverage. However, it will be apparent that metals other than tungsten may be used in the gate structure and that the adhesion layer may be omitted, if desired. Other metals which may be used include, but are not limited to, aluminum (Al), copper (Cu), titanium, (Ti), or ruthenium (Ru). Sidewall insulating layer 106 is formed on the sidewalls of gate structure 130 and an insulating layer 108 is formed on the silicon substrate 100.

FIGS. 2A and 2B through FIGS. 6A and 6B illustrate the steps for manufacturing the MOS transistor shown in FIGS. 1A–1C. FIGS. 2A, 3A, 4A, 5A, and 6A are upper plan views at various steps of the manufacturing process. FIGS. 2B, 3B, 4B, 5B, and 6B are cross-sectional views taken along the lines A–A' of FIGS. 2A, 3A, 4A, 5A, and 6A, respectively.

Figure 2A:
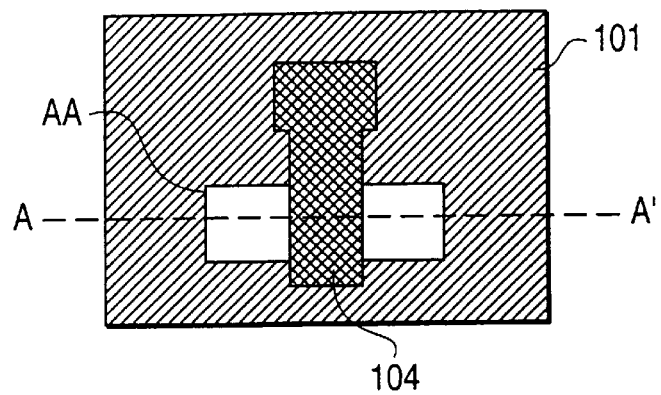
Figure 2B:
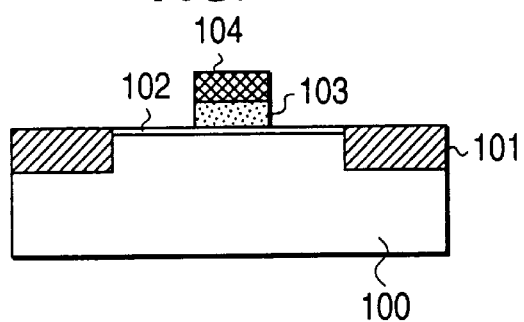

With reference to FIGS. 2A and 2B, shallow trench isolation region 101 of silicon dioxide ($SiO_2$), for example, is formed to define the isolated active area AA for the MOS transistor. Shallow trench isolation region 101 may be formed using any known technique. In one illustrative process, a mask of $Si_3N_4$ (silicon nitride)/$SiO_2$ is formed on the surface of substrate 100. Then, the mask and substrate 100 are etched using RIE to form a shallow trench having a depth of about 0.25 micrometers ($\mu$m) relative to the surface of substrate 100. Then, an oxide film approximately 10 nanometers (nm) in thickness is formed inside the shallow trenches by a high temperature (e.g., 850° C.) thermal oxidation. Next, a silicon dioxide film having a thickness of approximately 500 nanometers (nm) is deposited over the entire substrate by chemical vapor deposition (CVD) and planarized using chemical-mechanical polishing (CMP). The silicon nitride layer of the mask serves as a stopper layer for the CMP process. Finally, the surface of the substrate in the active area is exposed by removing the $Si_3N_4$/$SiO_2$ mask.

The surface of semiconductor substrate 100 in the active area AA is then annealed at a temperature of approximately 850° C. using a dry $O_2$ ambient to form a thermal oxide film 102 having a thickness of approximately 8 nanometers (nm). Thermal oxide film 102 serves as the gate dielectric film. An $N^+$ doped polysilicon layer having a thickness of approximately 100 nanometers (nm) and a silicon nitride ($Si_3N_4$) layer having a thickness of approximately 200 nanometers (nm) are then deposited on thermal oxide film 102. The silicon nitride layer is then patterned by a conventional lithography process and RIE to form a patterned silicon nitride layer 104. Then, the polysilicon layer is etched using the patterned silicon nitride layer 104 as a mask to form a polysilicon gate electrode 103. The polysilicon etching is highly selective in order that the etching is stopped at the thermal oxide film 102 to thereby reduce etching damage to the silicon substrate. After patterning, a post-etching oxidation of the sidewall of the polysilicon gate electrode may be performed to improve gate-to-silicon substrate leakage current and breakdown characteristics.

Figure 3A:
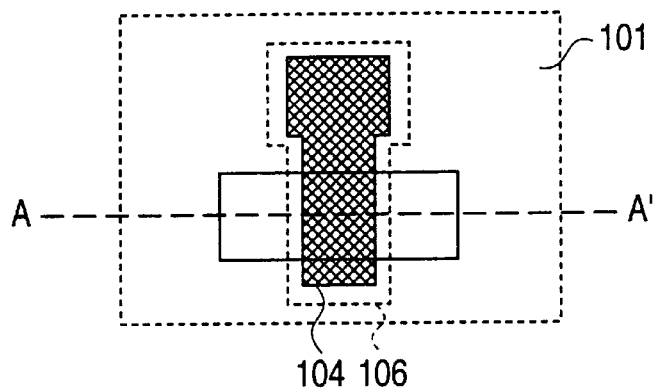
Figure 3B:
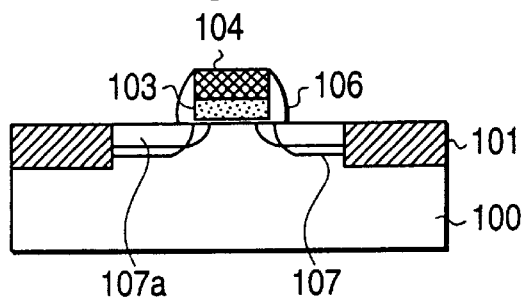

Subsequently, with reference to FIGS. 3A and 3B, lightly doped $N^+$ source/drain layers 107a are formed by an ion implantation. For example, arsenic may be implanted with a dose of $5\times10^{13}$/$cm^2$ and an acceleration voltage of 45 KeV. In the case of a PMOS transistor, lightly doped $P^-$ source/drain layers may be formed by an ion implantation of $BF_2$ with a dose of $5\times10^{14}$/$cm^2$ and an acceleration voltage of 20 KeV. It will be appreciated that the above-described doses and acceleration voltages are provided only as examples and the present invention is not limited in this respect.

A thin insulating layer of silicon dioxide ($SiO_2$), for example, having a thickness of approximately 20 nanometers (nm), is then blanket deposited over the surface of the substrate 100 using, for example, CVD. This blanket-deposited silicon dioxide layer is then selectively etched using, for example, RIE, to form side wall spacers 106 as shown in FIGS. 3A and 3B. If desired, substrate 100 and polysilicon gate electrode 103 may be oxidized by a rapid thermal oxidation (RTO) (for example, for 70 seconds at a temperature of 1050° C. in an $O_2$ atmosphere) to form a silicon dioxide film (not shown) having a thickness of about 5 nanometers (nm) prior to the deposition of the silicon dioxide by CVD. This thermal oxide layer is etched along with the deposited silicon dioxide.

After formation of the sidewall spacers 106, $N^+$ source/drain layers 107 are formed by an ion implantation of arsenic with a dose of $5\times10^{15}/cm^2$ and an acceleration voltage of 45 KeV. In the case of a PMOS transistor, $P^+$ source/drain layers are formed by an ion implantation of $BF_2$ with a dose of $3\times10^{15}/cm^2$ and an acceleration voltage of 20 KeV. Again, it will be appreciated that these doses and acceleration voltages are for purposes of illustration, and the invention is not limited in this respect. As noted above, it will be further appreciated that the present invention is not limited to MOS transistors having lightly doped source/drain regions or to MOS transistors having sidewall spacers. Thus, if desired, the above-described steps for forming these features may be omitted, if desired.

Figure 4A:
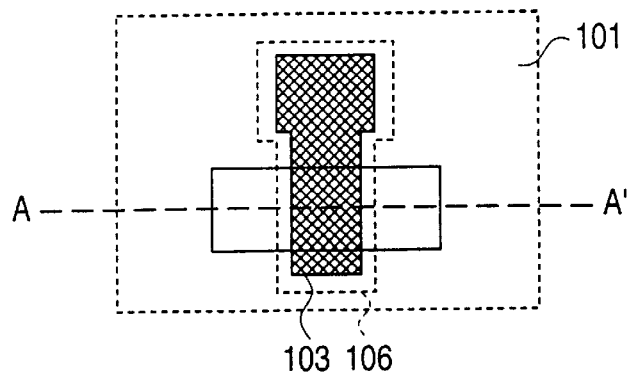
Figure 4B:
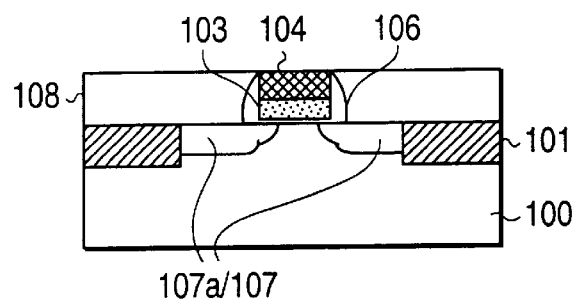

Next, as shown in FIGS. 4A and 4B, an insulating layer 108 of silicon dioxide, for example, is deposited using CVD and is then planarized using CMP. The patterned silicon nitride layer 104 serves as a stopper layer for the CMP processing, such that the level of the surface of insulating layer 108 is planarzed to be substantially even with the level of the surface of the patterned silicon nitride layer 104.

Figure 5A:
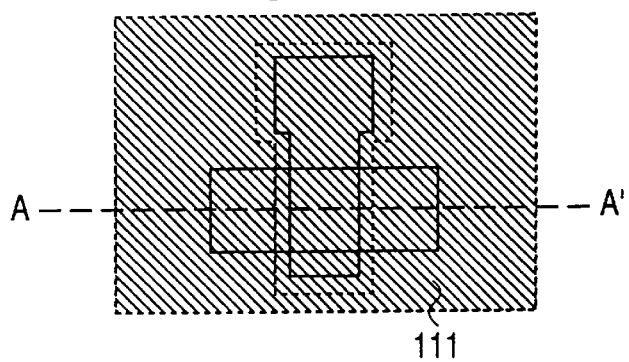
Figure 5B:
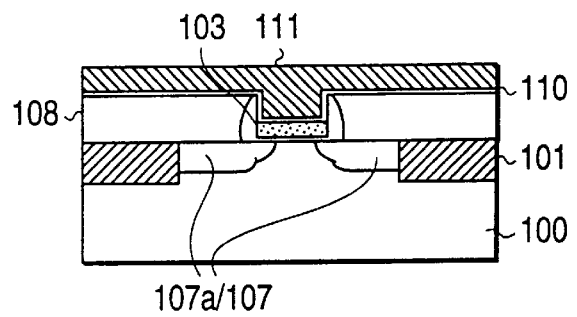

Next, with reference to FIGS. 5A and 5B, the patterned silicon nitride layer 104 is completely removed using a wet etch (for example, $H_3PO_4$ at 165° C. for 45 minutes) to form an opening over the polysilicon gate electrode 103. A titanium nitride (TiN)/titanium (Ti) layer 110 is then deposited on the upper surface of the silicon dioxide layer 108, the sidewall surface of insulating layer 108 formed by the groove, and the portion of polysilicon gate electrode 103 exposed by the groove. TiN/Ti layer 110 serves as an adhesion layer for the tungsten layer which will be deposited in a subsequent process step and also serves to improve contact resistance. As noted above, the formation of an adhesion layer may be omitted, if desired or appropriate. Next, a tungsten layer 111 having a thickness of approximately 200 nanometers (nm) is deposited by blanket CVD, for example.

Figure 6A:
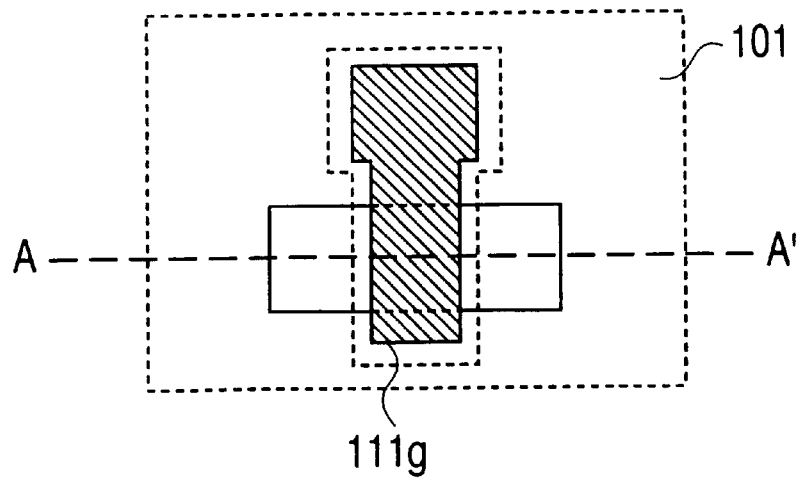
Figure 6B:
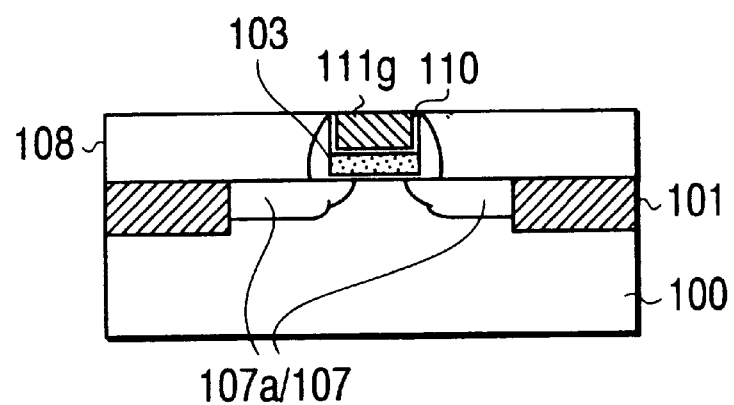

As illustrated in FIGS. 6A and 6B, the tungsten layer 111 is then planarized using CMP to form a tungsten strap 111g. Insulating layer 108 acts as a stopper layer for the CMP process.

In accordance with the above-described process, a gate structure having a low resistivity can be provided. In addition, since the tungsten strap is formed after high temperature processes for activating implanted impurities and for repairing substrate damage caused by RIE, undesirable reactions between the tungsten and the polysilicon can be avoided while providing a relatively large process window.

Figure 7A:
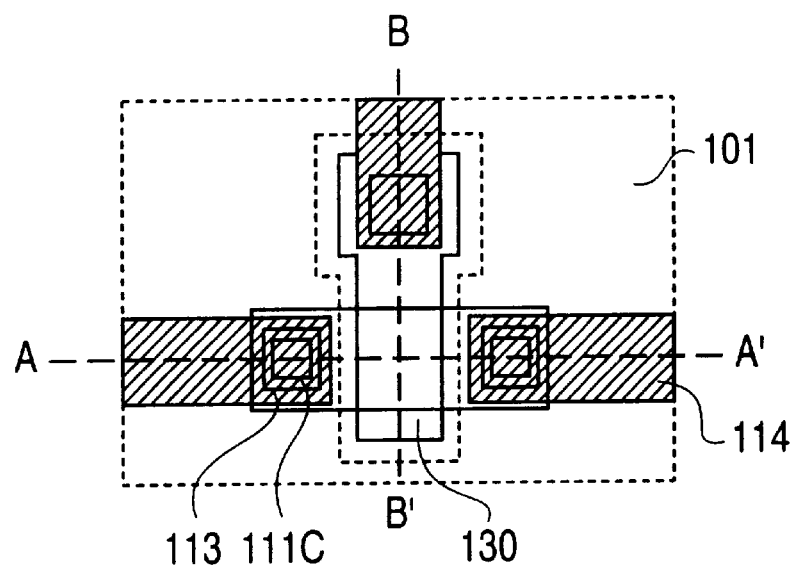
FIG. 7A is a top planar view of a MOS transistor in accordance with a second embodiment of the present invention.
Figure 7B:
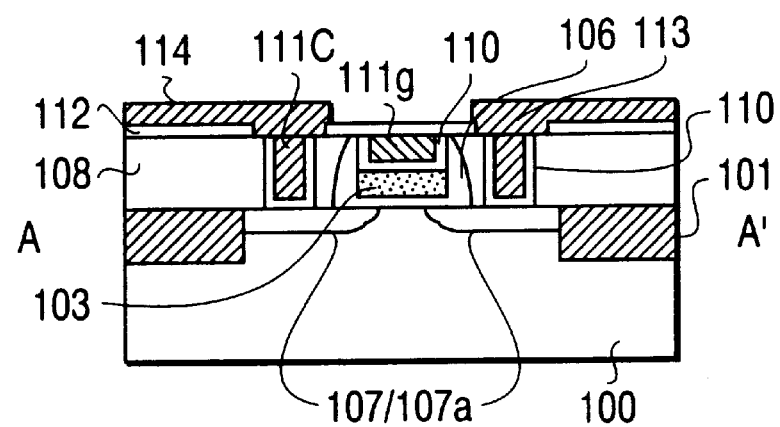
FIG. 7B is a cross-sectional view taken along line A–A' of FIG. 7A.
Figure 7C:
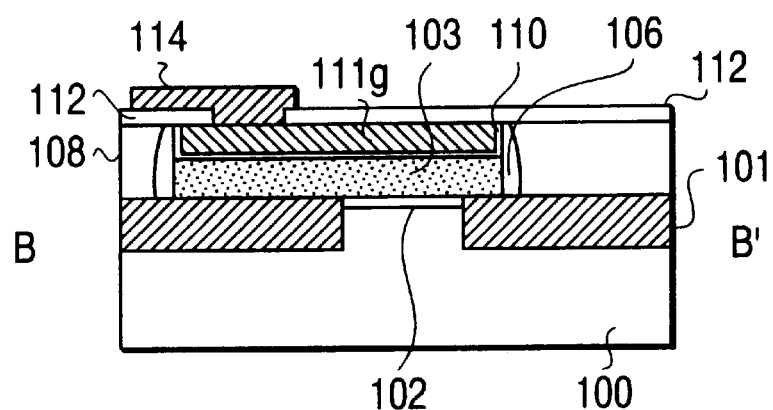
FIG. 7C is a cross-sectional view taken along line B–B' of FIG. 7A.

In accordance with a second embodiment of the present invention, a gate structure and a contact are formed simultaneously. FIGS. 7A, 7B and 7C illustrate a MOS transistor including a metal-strapped gate structure and metal-filled contacts 111c.

FIG. 7A is an upper plan view of the MOS transistor in accordance with the second embodiment; FIG. 7B is a cross-sectional view taken along line A–A' of FIG. 7A; and FIG. 7C is a cross-sectional view taken along line B–B' of FIG. 7A. As shown in FIGS. 7A, 7B, and 7C, the MOS transistor is formed on a P-type silicon substrate 100 having a <100> orientation and resistivity of between about 1–20 Ωcm. Substrate 100 may be a silicon wafer or an epitaxial layer formed on silicon. The MOS transistor may be formed directly on a substrate, as shown, or in a doped well region of a substrate. The MOS transistor is isolated from other elements (not shown) formed on substrate 100 by a shallow trench isolation (STI) region 101. A gate structure 130 includes a tungsten strap layer 111g, a titanium nitride/titanium layer 110, and a doped polysilicon gate electrode 103. Contact openings 109 each include the titanium nitride/titanium layer 110 formed on the sidewalls thereof and on the exposed portion of the corresponding source/drain region 107 and a tungsten (W) layer 111c. A first insulating layer 108 (for example, a silicon dioxide film deposited using chemical vapor deposition to have a thickness of approximately 150 nm), a second insulating layer 112, and a metal wiring layer 114 (for example, an aluminum-copper (Al—Cu) wiring layer) are formed on substrate 100. The metal wiring layer 114 contacts the tungsten layer 111c and titanium nitride/titanium layer 110 in the contact openings 109 through openings 113 in the second insulating layer 114. Sidewall layers 106 are formed on the sidewalls of gate structure 130, and source/drain regions (including lightly doped $N^+$ regions 107a and more heavily doped $N^+$ regions 107) are formed in the substrate 100. The gate structure 130 is insulatively spaced from a channel region between the source/drain regions 107 by a gate dielectric film 102. Gate dielectric film 102 is, for example, a thermal $SiO_2$ film having a thickness of about 8 nanometers (nm).

Figure 8A:
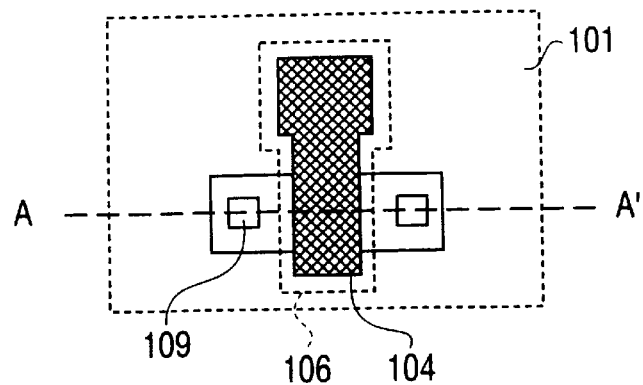
Figure 8B:
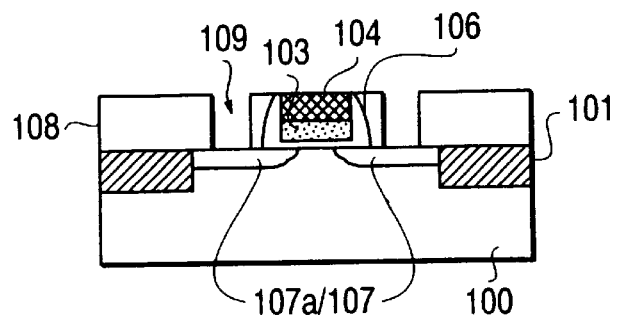
Figure 13:
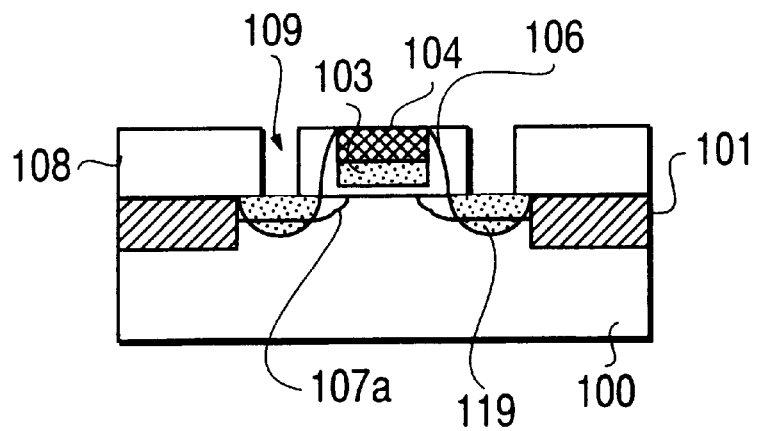
FIG. 13 provides an illustration of an optional additional step to the method of FIGS. 8–11.

The process of the second embodiment uses the same initial steps as described above with reference to FIGS. 2 and 3, and reference should be made to the above description. Next, as shown in FIGS. 8A and 8B, contact holes 109 as shown in FIG. 8A are formed using RIE to expose source/drain regions 107. If desired, as shown in FIG. 13, contact diffusion regions 119 for reducing contact resistance may be formed at this time by ion implantation (e.g., using an acceleration 14 voltage of 45 KeV and a dose quantity of $5\times10^{15}/cm^2$ of arsenic) and annealing (e.g., rapid thermal annealing RTA) at 950° C. for 10 seconds at $N_2$).

Figure 9A:
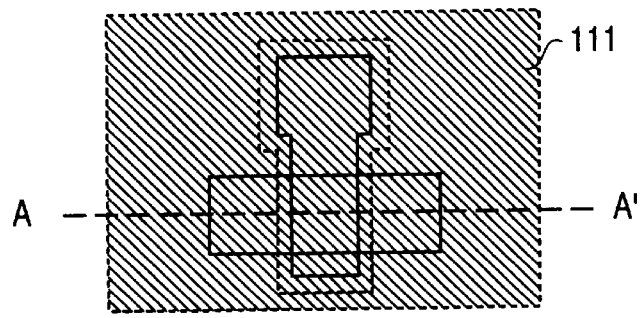
Figure 9B:
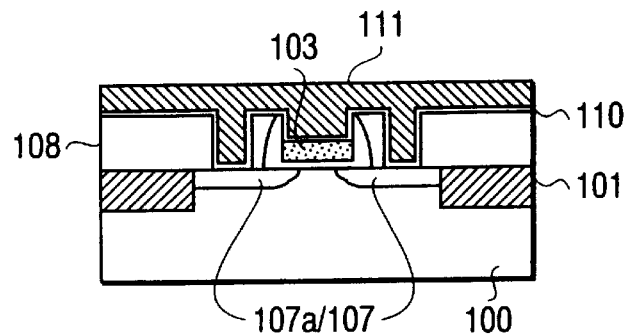

Next, with reference to FIGS. 9A and 9B, the patterned silicon nitride layer 104 is completely removed using a wet etch (e.g., $H_3PO_4$ at 165° C. for 45 minutes) to form an opening over the polysilicon gate electrode 103. A titanium nitride/titanium layer 110 is formed on the upper surface of insulating layer 108, on the sidewalls and on the polysilicon gate electrode exposed by removing the patterned silicon nitride layer 104, on the sidewalls of the contact holes 109, and on the portions of the source/drain regions 107 exposed by contact holes 109. The TiN/Ti layer 110 serves as an adhesion layer for the tungsten layer which will be deposited in a subsequent process step and also serves to improve contact resistance. As noted above, the step of forming an adhesion layer may be omitted, if desired.

After formation of layer 110, a tungsten (W) film 111 is deposited to simultaneously fill contact holes 109 and the opening over polysilicon gate electrode 103. The tungsten film 111 may be deposited, for example, by blanket chemical vapor deposition (CVD).

Figure 12:
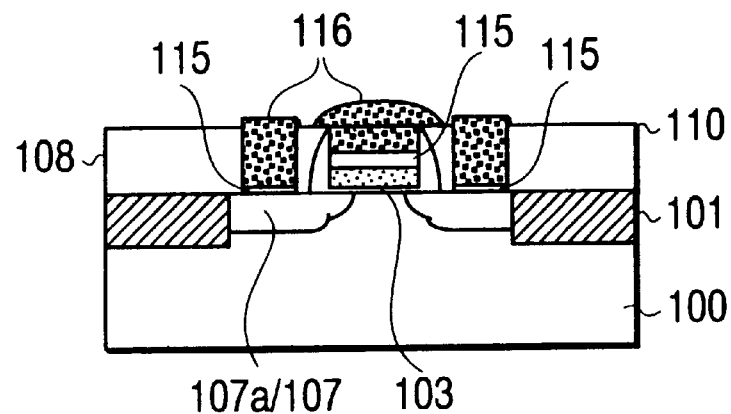
FIG. 12 provides an illustration of an alternative step of depositing tungsten using selective deposition.

Alternatively, as shown in FIG. 12, the tungsten may be deposited using selective deposition techniques to form deposits 116 in the contact holes 109 and in the opening above the polysilicon gate electrode 103. In this case, the step of forming layer 110 may be omitted and silicide layers 115 such as $TiSi_2$ or $CoSi_2$ may be formed on the exposed portions of polysilicon gate electrode 103 and source/drain regions 107 in order to protect these portions from damage during the subsequent tungsten deposition process. These silicide layers may be formed by depositing titanium or cobalt using a sputtering process and subsequent heating to form the desired silicide layer.

Figure 10A:
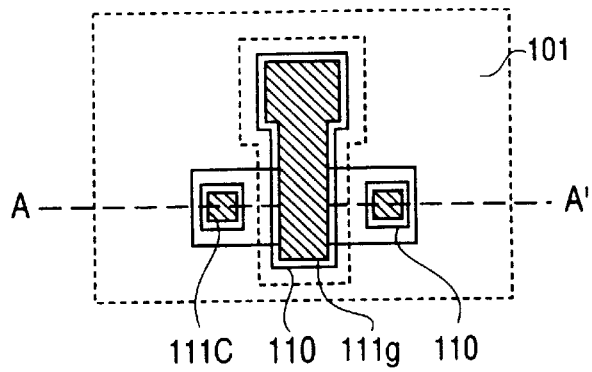
Figure 10B:
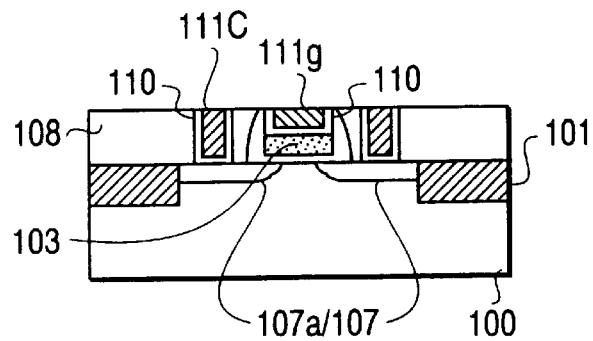
Figure 11A:
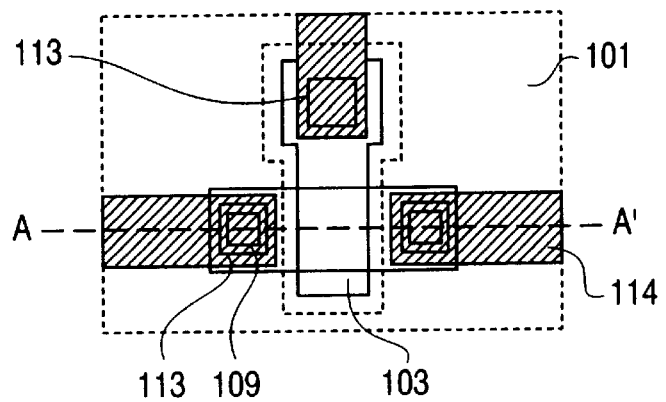
Figure 11B:
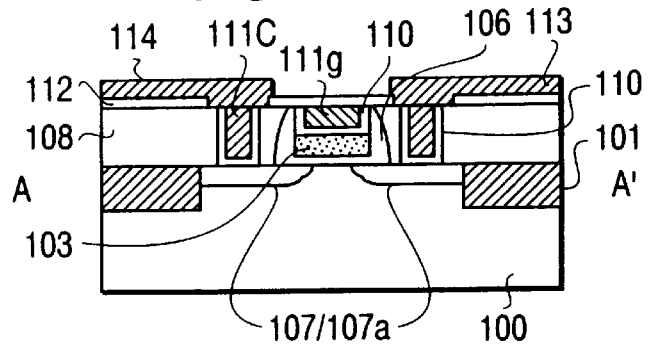

As illustrated in FIGS. 10A and 10B, the tungsten layer 111 is planarized using CMP. Insulating layer 108 acts as a stopper layer for the CMP process. As a result, tungsten contacts 111c and a tungsten strap 111g are simultaneously formed. An insulating layer 112 of silicon dioxide, for example, is then deposited using CVD and etched to form openings 113 as shown in FIGS. 11A and 11B. Finally, a metal (e.g., Al—Cu) wiring layer 114 is formed on the CVD insulator (oxide) layer 112 and fills in the openings 113 as shown in FIGS. 11A and 11B.

Figure 14:
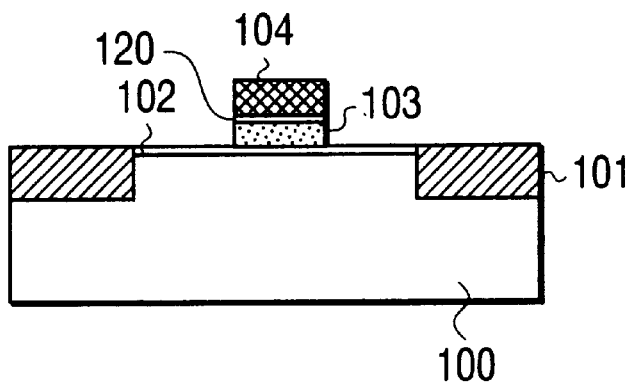
FIG. 14 provides an illustration of an optional additional feature of the structures of FIGS. 1 and 7.
Figure 15:
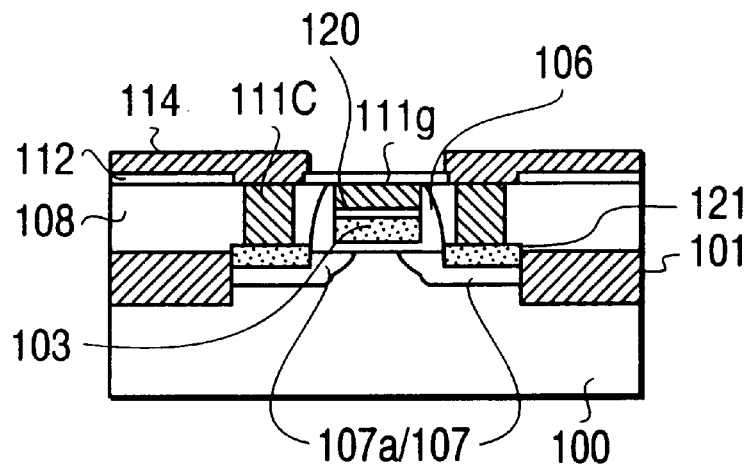
FIG. 15 provides an illustration of an optional additional feature of the structure of FIGS. 7A–7C.
Figure 16:
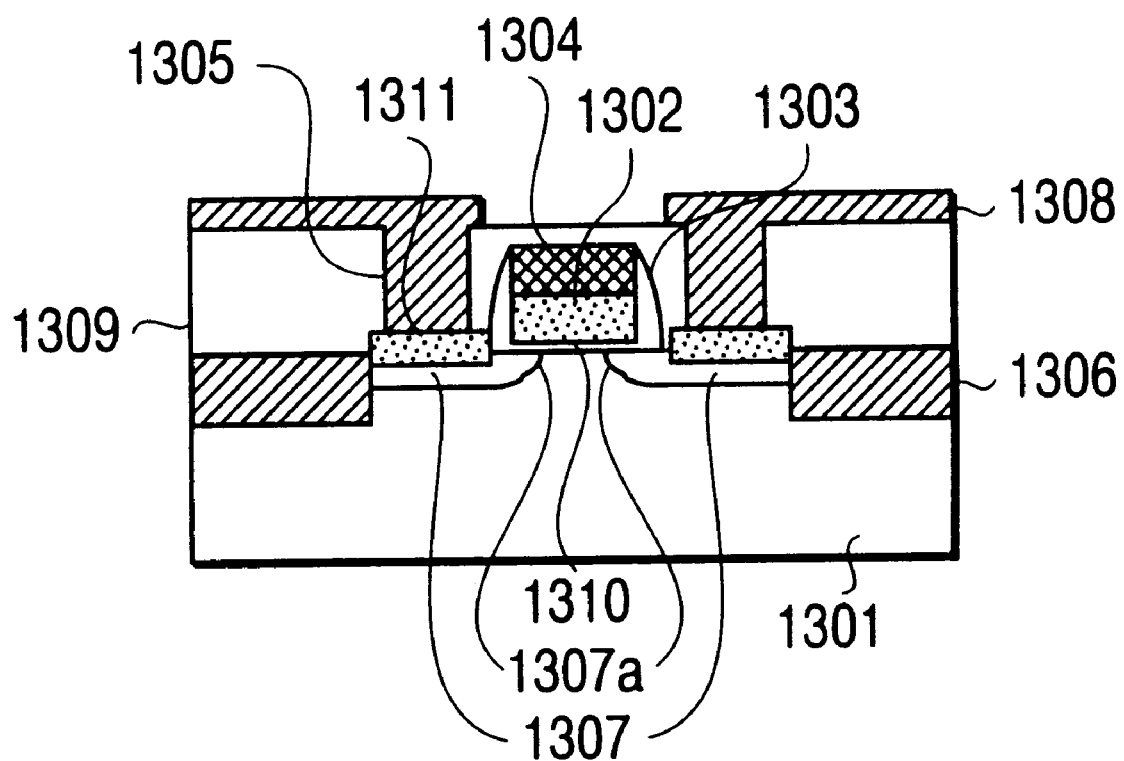
FIG. 16 provides an illustration of a MOS transistor formed according to a previously known method.

FIGS. 14 and 15 illustrate variations of the method according to the second embodiment of the present invention as described above. In FIG. 14, in order to reduce any reaction which might occur between the polysilicon gate electrode 103 and the tungsten metal strap 111g, a thin $WN_x$ layer 120 having a thickness, for example, of 10 nanometers may be formed over the polysilicon layer prior to deposition of the silicon nitride layer.

FIG. 15 shows silicide layers 121 formed under contact plugs 111c and on source/drain regions 107. These silicide layers 121 are formed by depositing a titanium or cobalt layer after the method steps illustrated in FIGS. 3A and 3B. These deposits are subsequently heated to produce the desired silicide by a reaction between Si and Ti (or Co). Notably, the formation of the $TiSi_2$ or $CoSi_2$ is self-aligning (the polysilicon gate is already protected by the patterned silicon nitride layer 104) such that no masking structure is required to form the silicide layer only for source/drain surface regions. The structure illustrated in FIG. 15 is used in such semiconductor devices as DRAMs, SRAMs, gate arrays and microprocessors. An advantage of this additional step is a reduction of contact resistance and a reduction of source/drain sheet resistance. In this case, the adhesion layer 115 is not needed for the source/drain regions 107 in the arrangement of FIG. 12.

The above described method according to the present invention achieves a reduction in the number of processing steps necessary to simultaneously form a metal strapped gate and a metal contact plug fill. Moreover, the annealing steps for activating implanted impurities to form the source/drain regions and for repairing substrate damage after RIE are performed prior to the deposition of tungsten (or other metal) gate layer 111g. As a result, undesirable reactions between the metal and the polysilicon gate layers can be reduced.

It will be appreciated that both PMOS and NMOS transistors may be formed together on the same substrate to provide for CMOS integrated circuits.

While the present invention has been particularly described with reference to the preferred embodiments, it should be readily apparent to those of ordinary skill in the art that changes and modifications in form and details may be made without departing from the spirit and scope of the invention. It is intended that the appended claims include such changes and modifications.

We claim:

1. A method for forming a metal-strapped polysilicon gate structure, comprising the steps of:

forming a gate dielectric layer on a surface of a substrate;
   forming a polysilicon layer on said gate dielectric layer;
   forming a masking layer on said polysilicon layer;
   patterning said masking layer;
   etching said polysilicon layer using said patterned masking layer as a mask to form a gate electrode;
   depositing an insulating layer on said substrate;
   removing said patterned masking layer, thereby forming an unfilled region above said gate electrode;
   depositing a metal to fill in said unfilled region; and
   planarizing the deposited metal such that an upper surface of said metal is substantially level with an upper surface of said insulating layer.

2. The method according to claim 1, wherein said metal is tungsten.

3. The method according to claim 1, wherein the deposited metal is planarized by a chemical mechanical polishing process.

4. The method according to claim 1, wherein said metal is deposited using a blanket deposition method.

5. The method of claim 1, further including the step of forming an adhesion layer on said gate electrode, the step of depositing said metal including depositing said metal on said adhesion layer.

6. The method of claim 5, wherein the step of forming the adhesion layer is performed after the step of removing said patterned masking layer.

7. The method of claim 5, wherein said adhesion layer comprises titanium nitride.

8. The method of claim 7, wherein said metal is tungsten.

9. The method of claim 1, wherein the step of depositing said metal includes depositing said metal to at least completely fill in said unfilled region.

10. The method of claim 1, wherein the step of depositing said metal includes depositing said metal to overflow said unfilled region onto a surface of said insulating layer.

11. The method of claim 10, further including the step of adjusting a surface of said metal to be coplanar with said insulating layer.

12. A method for forming a metal-strapped polysilicon gate structure and a metal contact structure, comprising the steps of:

forming a gate dielectric layer on a surface of a substrate;
   forming a polysilicon layer on said gate dielectric layer;
   forming a masking layer on said polysilicon layer;
   patterning said masking layer;
   etching said polysilicon layer using said patterned masking layer as a mask to form a gate electrode;
   implanting ions in the surface of said substrate using said patterned masking layer and said gate electrode as an implantation mask to thereby form spaced apart source/drain regions;
   depositing an insulating layer on said substrate;
   forming a contact hole in said insulating layer for contacting at least one of said source/drain regions;
   removing said patterned masking layer to form an unfilled region above said gate electrode; and
   depositing a metal to fill in said unfilled region and said contact hole.

13. The method according to claim 12, further comprising the step of polishing said insulating layer to planarize an upper surface of said insulating layer.

14. The method according to claim 12, further comprising the step of polishing said deposited metal to planarize an upper surface of said metal.

15. The method according to claim 12, wherein said metal is tungsten.

16. The method according to claim 12, wherein said masking layer is a silicon nitride layer.

17. The method according to claim 12, further comprising the step of forming insulating spacers on sidewalls of said patterned masking layer and said gate electrode prior to implanting ions in the surface of said silicon substrate.

18. The method according to claim 11, wherein said insulating spacers are formed of silicon dioxide.

19. The method according to claim 12, further comprising the step of forming a silicide layer on said source/drain regions.

20. A method according to claim 12, wherein said insulating layer is a silicon dioxide layer.

21. The method according to claim 12, wherein said contact hole aligns to said gate electrode in lithography.

22. The method according to claim 12, further comprising the step of forming a contact diffusion region after forming said contact hole.

23. The method according to claim 12, wherein said masking layer is removed using a wet etching process.

24. The method according to claim 12, wherein said metal is deposited using a selective deposition method in which said metal is deposited selectively in said unfilled region and said contact hole.

25. The method according to claim 12, wherein said metal is deposited using a blanket deposition method.

26. The method according to claim 13, wherein said polishing step is performed using a chemical mechanical polishing process.

27. The method of claim 12, further including the step of forming an adhesion layer on said gate electrode, the step of depositing said metal including depositing said metal on said adhesion layer.

28. The method of claim 27, wherein the step of forming the adhesion layer is performed after the step of removing said patterned masking layer.

29. The method of claim 27, wherein said adhesion layer comprises titanium nitride.

30. The method of claim 29, wherein said metal is tungsten.

31. The method of claim 12, wherein the step of depositing said metal includes depositing said metal to at least completely fill in said unfilled region.

32. The method of claim 12, wherein the step of depositing said metal includes depositing said metal to overflow said unfilled region onto a surface of said insulating layer.

33. The method of claim 32, further including the step of adjusting a surface of said metal to be coplanar with said insulating layer.

34. A method of forming a gate electrode comprising the steps of:
 forming a structure on a semiconductor substrate which is insulatively spaced from a channel region between source/drain regions formed on a surface of said semiconductor substrate, said structure including a first conductive layer and a cap layer formed on said first conductive layer;
 depositing an insulating layer on said semiconductor substrate and said structure;
 planarizing an upper surface of said insulating layer using said cap layer as a stopper;
 removing said cap layer to form an opening above said first conductive layer of said structure;
 depositing a conductive material in said opening; and
 planarizing an upper surface of said conductive material using said insulating layer as a stopper.

35. The method of claim 34, further including the step of forming an adhesion layer on said conductive layer, the step of depositing said conductive material including depositing said conductive material on said adhesion layer.

36. The method of claim 35, wherein the step of forming the adhesion layer is performed after the step of removing said cap layer.

37. The method of claim 35, wherein said adhesion layer comprises titanium nitride.

38. The method of claim 37, wherein said conductive material is tungsten.

39. The method of claim 34, wherein the step of depositing said conductive material includes depositing said conductive material to at least completely fill said opening.

40. The method of claim 34, wherein the step of depositing said conductive material includes depositing said conductive material to overflow said opening onto the upper surface of said insulating layer.

41. A method of simultaneously forming a gate electrode and a contact, comprising the steps of:
 forming a structure on a semiconductor substrate which is insulatively spaced from a channel region between source/drain regions formed on a surface of said semiconductor substrate, said structure including a first conductive layer and a cap layer formed on said first conductive layer;
 depositing an insulating layer on said semiconductor substrate and said structure;
 planarizing an upper surface of said insulating layer using said cap layer as a stopper;
 forming contact holes to expose at least one of said source/drain regions;
 removing said cap layer to form an opening above said conductive layer of said structure;
 depositing a conductive material to simultaneously fill said opening and said contact holes; and
 planarizing an upper surface of said conductive material using said insulating layer as a stopper.

42. The method of claim 41, further including the step of forming an adhesion layer on said conductive layer, the step of depositing said conductive material including depositing said conductive material on said adhesion layer.

43. The method of claim 42, wherein the step of forming the adhesion layer is performed after the step of removing said cap layer.

44. The method of claim 42, wherein said adhesion layer comprises titanium nitride.

45. The method of claim 44, wherein said conductive material is tungsten.

46. The method of claim 41, wherein the step of depositing said conductive material includes depositing said conductive material to at least completely fill each of said opening and said contact holes.

47. The method of claim 41, wherein the step of depositing said conductive material includes depositing said conductive material to overflow each of said opening and said contact holes onto the upper surface of said insulating layer.

* * * * *

UNITED STATES PATENT AND TRADEMARK OFFICE
CERTIFICATE OF CORRECTION

PATENT NO. : 6,124,189
DATED : September 26, 2000
INVENTOR(S) : Toru Watanabe, et al.

It is certified that error appears in the above-identified patent and that said Letters Patent is hereby corrected as shown below:

Claim 18, column 9,
Line 5, "11" should be replaced with -- 17 --.

Claim 20, column 9,
Line 10, "A" should be replaced with -- The --.

Signed and Sealed this

Twenty-third Day of October, 2001

Attest:

*Nicholas P. Godici*

NICHOLAS P. GODICI
*Attesting Officer*    *Acting Director of the United States Patent and Trademark Office*